United States Patent [19]

Falckenberg et al.

[11] Patent Number: 4,664,745
[45] Date of Patent: May 12, 1987

[54] METHOD AND APPARATUS FOR MANUFACTURING TAPE-SHAPED SILICON CRYSTALS WITH A THREADED CARRIER

[75] Inventors: Richard Falckenberg, Wald; Josef Grabmaier, Berg, both of Fed. Rep. of Germany

[73] Assignee: Siemens Aktiengesellschaft, Berlin and Munich, Fed. Rep. of Germany

[21] Appl. No.: 755,587

[22] Filed: Jul. 16, 1985

[30] Foreign Application Priority Data

Jul. 31, 1984 [DE] Fed. Rep. of Germany ....... 3428257

[51] Int. Cl.⁴ .......................................... C30B 15/06
[52] U.S. Cl. .................... 156/622; 156/608; 156/617 H; 156/DIG. 88; 156/DIG. 97; 427/86
[58] Field of Search .................. 156/617 H, DIG. 88, 156/DIG. 97, DIG. 73, 622, 608; 422/246, 254; 427/86

[56] References Cited

U.S. PATENT DOCUMENTS

| | | | |
|---|---|---|---|
| 4,305,776 | 12/1981 | Grabmaier | 156/605 |
| 4,319,953 | 3/1982 | Grabmaier | 156/622 |
| 4,329,195 | 5/1982 | Kudo | 156/DIG. 97 |
| 4,554,203 | 11/1985 | Grabmaier et al. | 427/86 |
| 4,563,976 | 1/1986 | Foell et al. | 156/617 H |
| 4,563,979 | 1/1986 | Falckenberg | 156/617 H |

OTHER PUBLICATIONS

Bates and Jewett article entitled: "Low Angle Silicon Sheet Growth: A Review of Progress, Problems and Promise," appearing in Proceedings of the Flat-Plate Solar Array Project Research Forum on the High-Speed Growth and Characterization of Crystals for Solar Cells dated Apr. 15, 1984, identfied as JPL Publication 84-23.

Primary Examiner—John Doll
Assistant Examiner—Robert M. Kunemund
Attorney, Agent, or Firm—Hill, Van Santen, Steadman & Simpson

[57] ABSTRACT

A method for horizontal silicon tape drawing is provided which can be practiced at a high drawing speed. The carrier member uses parallel threads of a material having a higher emission factor $\epsilon$ than the emission factor of molten silicon and such threads serve as crystallization nucleators for silicon. A silicon melt tank is used which has a length l that is at least as long as the contacting length existing between the surface of molten silicon and the horizontally moving threads so that $L = V_z \cdot t$ where $v_z$ is the drawing speed and t is the dwell time. The drawing direction $d_z$ is set inclined at an angle $\alpha \leq 10°$ relative to the horizontal. Radiant losses from the silicon melt surface are regulated by reflectors. The method provides the possibility of manufacturing tape-shaped silicon crystals 16 for solar cells with a constant thickness and width.

6 Claims, 3 Drawing Figures

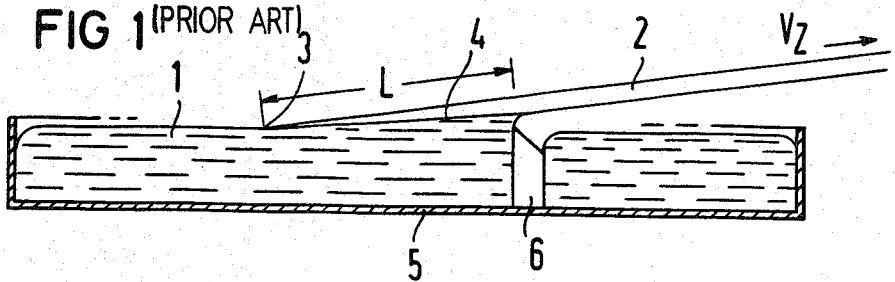
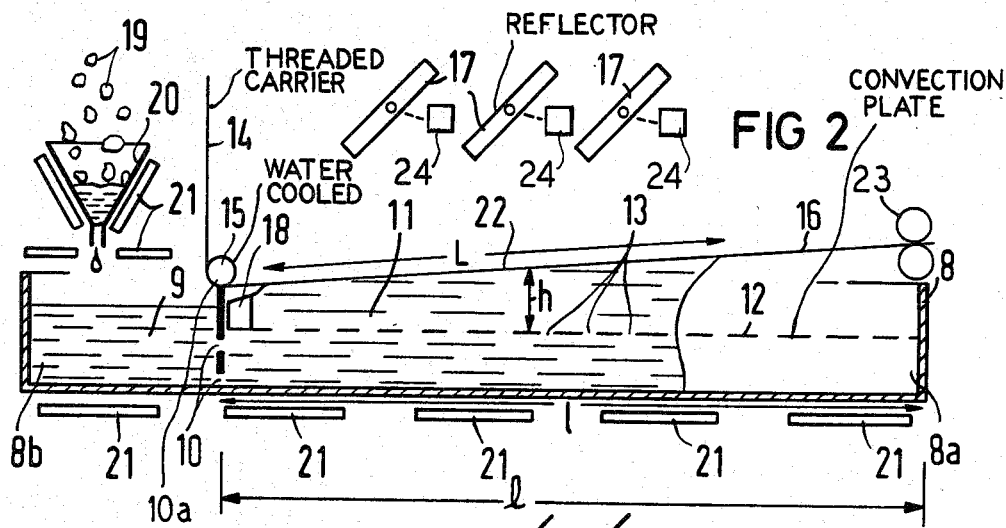
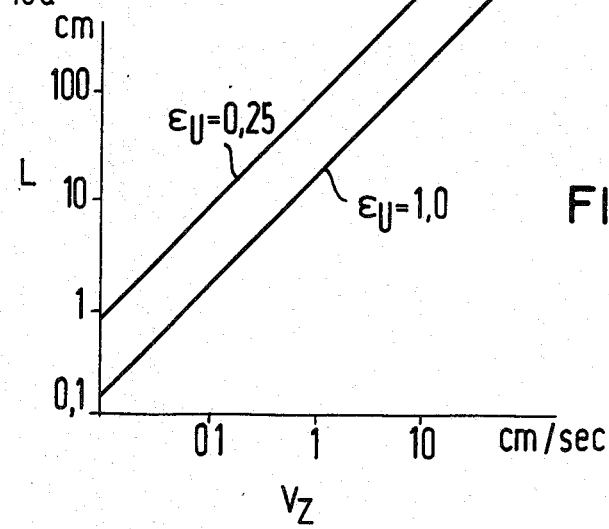

METHOD AND APPARATUS FOR MANUFACTURING TAPE-SHAPED SILICON CRYSTALS WITH A THREADED CARRIER

BACKGROUND OF THE INVENTION

1. Field of the Invention

The present invention lies in the field of tape-shaped silicon crystals and of methods for producing the same wherein a horizontally moving carrier member is drawn over the surface of a silicon melt.

2. Description of the Prior Art

A procedure for making tape-shaped silicon crystals for semiconductor components may be derived from the U.S. Pat. No. 4,305,776. A transportable tape, for example, a graphite net, provided with a special perforation system is employed as the nucleation center carrier and the crystallization of the molten silicon in the meshes of the net is effected by a stream of cooling gas.

Cost-favorable silicon for solar cells can be manufactured in this way since the silicon is directly converted into planar form from the melt without intermediate steps.

In addition to the efficiency of the solar cells made from this planar silicon, the surface velocity with which this material is produced is the main criterion for the economic feasibility of the method. The surface velocity is fundamentally limited by the latent heat released in the crystallization which must be dissipated to the same degree to which it arizes. Due to the favorable relationship of crystallization face to heat-dissipating surface, horizontal methods of silicon crystal formation offer considerable advantages over vertical methods. Silicon tapes can thus be drawn with speeds up to about 80 cm/min with the so-called LASS method (=low angle silicon sheet) disclosed in an article by Bates and Jewett in Proceedings of the Flat-Plate Solar Array Project Research Forum on the High-Speed Growth and Characterization of Crystals for Solar Cells, July 25-27, 1983, Port St. Lucie, Fla. pages 297-307. This method does not employ any carrier member for the coating. However, it has two disadvantages that shall be explained in greater detail with reference to FIG. 1:

1. The crystallization rate at the front edge 3 (as seen in drawing direction $d_z$, see arrow) of the silicon crystallization face 4 (equal to the guiding edge of the growing silicon tape 2) must be the same as the drawing speed. At high drawing speeds, this can only be achieved by undercooling of the silicon melt 1 and dendrite growth. Due to the irregularities of the layer formation connected therewith, however, dendrite growth means a reduction in the efficiency of the solar cells fabricated from this material.

2. The desired dimensions of the tape (width, thickness) cannot be kept constant over a longer time. The cause of this is the short time span t during which the silicon layer must form and has contact with the melt (dwell time). It derives from the length L of the crystallization face 4 and from the drawing speed $v_z$ at $t = L/v_z = 2/80 = 1.5$ sec. Due to the finite heat capacity of the melt vessel 5 and the melt 1, random temperature fluctuations in the melt 1 cannot be leveled out in this short time. They fully influence the temperature gradient in the melt 1 which is essential for the layer growth, that is, they lead to geometry changes of the growing silicon tape 2. The stripper for the silicon melt 1 which is attached to the melt vessel 5 is reference 6.

BRIEF SUMMARY OF THE INVENTION

More particularly, this invention is in one aspect directed to a method for manufacturing tape-shaped silicon crystals which are suitable for use in semiconductor components, especially in solar cells. In the method, a carrier structure which is resistant to a silicon melt is drawn horizontally and tangentially over the surface of a silicon melt situated in a tank. The carrier structure also provides crystallization nucleii for the formation of crystalline silicon. In the process, the carrier structure becomes coated with molten silicon and the silicon crystallizes.

In another aspect, this invention is directed to apparatus suitable for implementing such method.

A principal object of the present invention is to avoid the disadvantages caused by the LASS method.

Another object is to manufacture a silicon tape with an adjustable width and a constant layer thickness at high drawing speeds.

Such objects are achieved by the method of this invention in that:

(a) threads of a material having a higher emission factor $\epsilon$ in comparison to the silicon metal which extend parallel to the drawing direction are employed as carrier member and as crystallization nucleator;

(b) a tank is employed for the melt, where length l is dimensioned so that a contacting length L between melt and a tangential carrier member with $L < l$ can be set such that $L = v_z \cdot t$, where $v_z$ denotes the drawing speed and t denotes the dwell time;

(c) the drawing direction ($d_z$) is set inclined at an angle of less then 10° relative to the horizontal; and (d) reflectors are disposed above the melt, which, in combination with heaters situated under the bottom surface of the tank, regulate the radiation from the surface of the silicon melt such that the temperature remains in the region of the melting temperature of silicon ($T_M = 1420°$ C.).

Other and further objects, aims, purposes, features, advantages, examples, embodiments and the like will be apparent to those skilled in the art from the teachings of the present application.

BRIEF DESCRIPTION OF THE DRAWINGS

In the drawings:

FIG. 1 is a vertical longitudinal diagrammatic view showing the crucible arrangement used in the practise of the prior art LASS method described in the Background section of the specification;

FIG. 2 is a vertical longitudinal diagrammatic view of an embodiment of apparatus for this invention which is suitable for the implementation of the method of the present invention; and FIG. 3 is a plot showing the dependency of the drawing speed $v_z$ (cm/sec) on the length L (cm) of the contacting surface between a silicon melt and a silicon tape for achieving a final tape layer thickness dE of 300 μm given an ambient temperature of up to 300° C.

DETAILED DESCRIPTION

It lies within the scope of the present invention that a tank 8a, 8b is employed whose depth h over the entire length l or over a sub-length l' is dimensioned such that a moistening final thickness $d_E$ of the produced silicon tape can be achieved in the range of about 100 through 140 μm (microns) according to the relationship: $d_E < 0.05\, h$.

Referring to FIG. 2, there is seen an embodiment of the horizontal drawing process according to the present invention. A carrier member is employed which is comprised of a plurality of transversely spaced but longitudinally parallel graphite threads 14. The threads 14 are moved (drawn) across the surface of a silicon melt 11. A melt tank 8 to hold a silicon supply melt 11 is employed. Tank 8 has a main portion 8a whose length l is at least equal to or greater than the contacting length L existing between the surface of melt 11 and threads 14. The length L is determined by the drawing speed $v_z$ and the dwell time t of the threads 14 on, or, alternatively, in, the melt 11 so that: $L = v_z \cdot t$. A drive means 23 is provided which is disposed outside of melt tank 8 and which is adapted to provide a settable drawing direction $d_z$ that is inclinable at angles equal or greater than 0, but less than 10° relative to the horizontal.

A portion 8b of the melt tank 8 serves as a reservoir for a silicon supply melt 9 which is connected to the main silicon melt 11 through channels 10 in a partition member 10a. In order to avoid convection currents, a height-adjustable bottom plate 12 is situated in the portion 8a of the melt tank 8. Bottom plate 12 extends in a horizontal direction. Bottom plate 12 is provided with perforations 13 for the passage of the melt 11 therethrough.

Care is taken in the drawing process that silicon crystal growth can occur simultaneously over then full contacting length L upon the melt 11. Thus, graphite threads 14 serving as crystallization nucleation centers are brought into contact with the surface of the melt 11, and are drawn tangentially across the surface of the melt 11. The threads 14 are supplied to the melt surface (or the surface of the crystallization layer 22) by a deflection roller 15 which is situated over the melt tank 8. Roller 15 is preferably water-cooled in order to increase the heat dissipation from the graphite threads 14. The transverse spacing between adjacent threads 14 lies in the range from about 2 to 15 mm.

The graphite threads 14 have an emission coefficient $\epsilon_s$ of 0.6. The emission coefficient $\epsilon_L$ of the silicon melt 11, by contrast, amounts to only 0.3. Thus, the immediate environment of the threads 14 cools more rapidly than the silicon melt 11 itself. Given a suitable silicon melt temperature $T_L \simeq T_M$, where $T_M$ is the melting temperature of silicon, silicon thus crystallizes out along the threads 14. This crystallization layer 22 developes completely independently of the drawing speed $v_z$ of the threads 14 and is a function only of the silicon surface temperature and of the temperature gradient in the melt 11. The silicon crystallizing layer 22 spreads laterally and vertically from the threads 14 since the emission coefficient $\epsilon_s$ of solid silicon is 0.46, which value is likewise higher than the $\epsilon_L$ of molten silicon. This type or development of crystallization can be referred to as surface crystallization. In, for example, the method disclosed in U.S. Pat. No. 4,305,776, the crystallization predominantly proceeds from the cooled surface of the melt. There, the graphite net acts like a cover member on the melt surface.

In accordance with the teachings of the present invention, the drawing direction $d_z$ (see arrow) is set at an angle of inclination which extends from equal or greater than 0° up to about 10° relative to the horizontal. The bath length L over which a crystallization occurs derives from the drawing speed $v_z$ and the required dwell time t of the growing layer 22 on the melt 11, so that: $L = v_z \cdot t$ (see FIG. 3 as well).

With a given final thickness $d_E$ of the silicon layer (silicon crystalline tape layer 16), the dwell time t can be calculated from the growth rate. Parameters are the power radiated by the surface of the melt 11, or, alternatively, by the surface of the layer 22 as well as the temperature gradients in the layer 22 and melt 11. The temperature gradient in the melt 11 depends on the height h thereof. In particular, the parameters can be set such that the layer thickness $d_E$ of a tape layer 16 asymptotically approaches its final thickness. This final thickness $d_E$ is linked to the height h of the melt; thus, $d_E \leq 0.05$ h. A silicon melt height h of, for example, 3 mm corresponds to a stable final thickness $d_E$ of 150 μm in the silicon crystalline layer 16. When the produced tape 16 is allowed to glide over the melt 11 under these conditions for a longer time, then potentially existing irregularities in the layer thickness can be compensated.

The temperature gradients are regulated by a plurality of reflectors 17 which are positioned over the surface of the melt 11, or over the surface of the layer 22. The reflectors 17 are here constructed as flaps whose angular position or orientation regulates the magnitude of the radiant heat loss. The angular position of reflectors 17 relative to the surfaces of melt 11 and layer 22 is set by control means 24. A further control capability exists in the selection of the reflective material employed in or on the flaps, in a given use situation. Reflector plates or flaps each surfaced with a different reflective material and having generally planar facial surfaces can be arranged on a pivot axis in the manner of a prism. Vapor-deposited coatings on individual plates or flaps can be removed by a glow discharge during a revolution.

A cross-beam 18 of graphite or silicon carbide is inserted into the melt tank 8 adjacent the tank's side facing the incoming (uncoated) threads 14. Beam 18 prevents the silicon melt 11 from being entrained by the threads 14, or alternatively, by the product silicon tape 16, caused by an adhesion tension between the silicon melt 11 and the beam 18.

The threads 14 which act as nucleators also simultaneously serve to withdraw the crystallized layer 16 from the melt 11 in the drawing direction as soon as the desired final thickness $d_E$ is reached. Silicon carbide, quartz (optionally coated with a graphite layer) and aluminum oxide can also be employed as material or threads 14 in addition to graphite.

The silicon replenishment apparatus 19 comprises a heatable melt funnel 20 and the tank portion 8b which, as already described, communicates with the main portion 8a through channels 10. Funnel 20 and tank portions 8a and 8b are separately heatable, so that the heating of the tank portion 8b is regulated in order to make the melt 9 flowing from portion 8b into portion 8a have the same temperature as the melt 11 already situated in the tank portion 8a. The various heater elements serving for heating the tank portions 8a and 8b and the melt funnel 20 are referenced 21 and are located under tank 8.

FIG. 3 shows the dependency between the contacting length L in cm (commencing at the beginning of the surface or crytallization at the threads 14 and extending up to the formed, separated silicon tape 16) and the drawing speed $v_z$ in cm/sec for various emission factors $\epsilon_U$ (U=environment) of the melt covering (reflectors) for a final layer thickness of 300 μm and an ambient temperature up to 300° C. It may be derived from the diagram that drawing speeds on the order of 1 cm/sec require a contacting length L of 17 cm and that drawing speeds on the order of 10 cm/sec correspond to contacting lengths of 170 cm. The method and apparatus of the invention can thus be employed to produce silicon tape at high drawing speeds.

Although the teachings of our invention have herein been discussed with reference to specific embodiments, it is to be understood that these are by way of illustration only and that others may wish to utilize our invention in different designs or applications.

We claim:

1. In a method for manufacturing tape-shaped silicon crystals for semiconductor components, and particularly for solar cells, of the type where a carrier member resistant to a silicon melt is drawn tangentially in a horizontal direction across such a melt situated in a tank and is thereby coated with silicon, and whereby such a carrier member is also a crystallization nucleus for the build-up of a crystalline silicon tape the improvement which comprises in combination:
    (a) employing as said carrier member one which has threads comprised of a material having a higher emission factor $\epsilon$ in comparison to the silicon melt said threads being generally to the drawing direction, and said threads serving as crystallization nucleators;
    (b) situating said melt in a tank whose length $l$ is dimensioned such that a contacting length L between said melt and said carrier member with $L < l$ can be set such that $L = v_z \cdot t$, whereby $v_z$ denotes the drawing speed of said carrier member and t denotes the dwell time;
    (c) inclining the drawing direction ($d_z$) at an angle of less than 10° relative to the horizontal; and
    (d) disposing reflectors above said melt and heaters below the bottom surface of said tank, thereby regulating radiation from the surface of said melt so that the temperature of the melt surface remains in the region of the melting temperature of silicon which is about 1420° C.

2. The method of claim 1, wherein said tank has a depth (h) over the entire said length $l$ or over a part of that length $l$ and is dimensioned such that a constant final thickness $d_E$ is achievable for such tape-shaped silicon crystals in the range of 100–400 μm such that $d_E \geq 0.05 h$.

3. The method of claim 1 wherein said thread is comprised of a material selected from the group consisting of graphite, silicon carbide, quartz, graphitizied quartz and aluminum oxide.

4. The method of claim 1 wherein the spacing of such parallel threads ranges between about 2 and 15 mm.

5. The method of claim 1 wherein said drawing speed $v_z$ is set at about 10 cm/sec for a layer thickness of said tape-shaped silicon crystals of about 300 μm and for a contacting length L of from about 150 to 200 cm.

6. The method of claim 1 wherein for compensating fluctuations in layer thickness of said tape-shaped silicon crystals, said carrier member is moved across said melt for a longer time.

* * * * *